United States Patent
Kumar et al.

(10) Patent No.: US 12,021,550 B2
(45) Date of Patent: Jun. 25, 2024

(54) COMPRESSION ENGINE WITH CONFIGURABLE SEARCH DEPTHS AND WINDOW SIZES

(71) Applicant: Intel Corporation, Santa Clara, CA (US)

(72) Inventors: Smita Kumar, Chandler, AZ (US); Sailesh Bissessur, Phoenix, AZ (US); David K. Cassetti, Tempe, AZ (US); Stephen T. Palermo, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 593 days.

(21) Appl. No.: 17/119,892

(22) Filed: Dec. 11, 2020

(65) Prior Publication Data

US 2021/0135685 A1 May 6, 2021

(51) Int. Cl.
G06F 16/00 (2019.01)
G06F 16/22 (2019.01)
H03M 7/30 (2006.01)
H03M 7/40 (2006.01)

(52) U.S. Cl.
CPC ...... *H03M 7/3086* (2013.01); *G06F 16/2255* (2019.01); *H03M 7/40* (2013.01)

(58) Field of Classification Search
CPC .... G06F 16/2255; H03M 7/3086; H03M 7/40
See application file for complete search history.

(56) References Cited

U.S. PATENT DOCUMENTS

| | | | |
|---|---|---|---|
| 2019/0123763 A1 | 4/2019 | Bissessur et al. | |
| 2019/0207624 A1* | 7/2019 | Cassetti | H03M 7/3088 |
| 2019/0273507 A1 | 9/2019 | Cassetti et al. | |
| 2020/0036389 A1* | 1/2020 | Suresh | H03M 7/425 |
| 2020/0162100 A1* | 5/2020 | Beckman | G06F 12/0815 |
| 2020/0326910 A1* | 10/2020 | Parikh | H03M 7/40 |
| 2022/0360279 A1* | 11/2022 | Bo | H03M 7/6023 |
| 2022/0398019 A1* | 12/2022 | Fukazawa | G06F 3/0679 |

* cited by examiner

*Primary Examiner* — Cheryl Lewis
(74) *Attorney, Agent, or Firm* — Compass IP Law PC

(57) ABSTRACT

Examples described herein relate to an encoder circuitry to apply one of multiple lossless data compression schemes on input data. In some examples, to compress input data, the encoder circuitry is to utilize a search window size and number of searches based on an applied compression scheme. In some examples, content of a memory is reconfigured to store data corresponding to a search window size of the applied compression scheme. In some examples, an applicable hash function is configured based on the applied compression scheme. In some examples, a number of searches are made for a byte position. In some examples, the encoder circuitry includes a hash table look-up and a bank decoder. In some examples, the hash table look-up is to generate a hash index to identify an address of an entry in the search window. In some examples, the bank decoder is to select a bank based on the hash index.

21 Claims, 8 Drawing Sheets

COMPRESSION ENGINE WITH CONFIGURABLE SEARCH DEPTHS AND WINDOW SIZES

Data compression schemes seek to reduce the size of data using various methods including reducing the data redundancy in messages and improving data coding and data approximation methods. An objective of data compression is to reduce the amount of data required to store and/or transmit digital content. Various compression algorithms use different encoding techniques such as statistical encoding methods (e.g., Huffman Coding, Arithmetic Encoding, or Finite State Entropy/Asymmetric numeral systems (ANS)), Run Length Encoding, and Dictionary Encoding (e.g., Lempel Ziv encoding schemes (e.g., LZ77, LZ78, LZ4, and LZ4s) or Zstandard).

DETAILED DESCRIPTION

Figure 1:
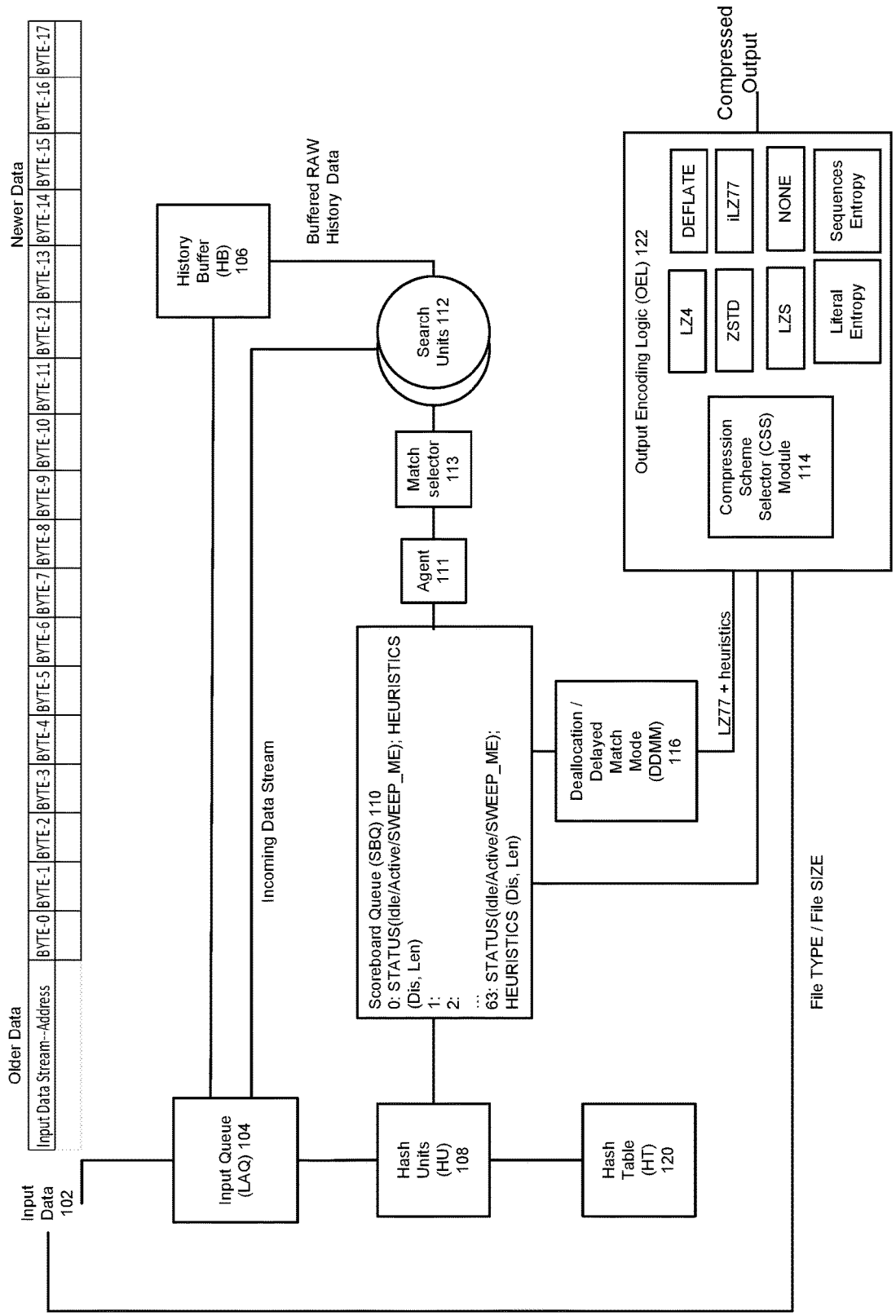
FIG. 1 depicts an encoder system.

Lossless compression schemes attempt to reconstruct an original message exactly from a compressed representation of a message. Lossless data compression can include a pre-processing stage, a search stage that transforms the input data by replace repeated patterns, a probability step that identifies high-frequency input data patterns, and an entropy encoding stage that uses the probability information to code the input data to produce the compressed output.

Dynamic probability models such as the Lempel-Ziv (LZ) algorithm dynamically build a pattern dictionary as they incrementally encounter input data. The pattern dictionary can be dynamically rebuilt when the data is decompressed so no additional data can be transmitted to describe the dictionary that goes along with the compressed data. Some LZ implementations (e.g., zlib and zstd) support use of an initial dictionary to improve initial compression ratio. The LZ family includes compressions standards such as gzip and gif. These dictionary-based algorithms make no assumptions about the type of the input data so they are flexible enough to support a range of file types or messages including text, images, or video.

LZ encoders can compress input data utilizing prior input data information of the input data stream known as the history. In general, LZ encoders can search the input data history, for a string that matches a portion of the input data stream. If such a match is found, the LZ encoder encodes the matched next portion of the input data using a reference (offset and length) to the matching string in the history. Otherwise, the LZ encoder encodes a next character of the input data stream as a raw data code or literal that designates the character as plain text. Use of the last or most recent encoded portion of the input data stream is then added to the history and will be included in the search to match the next portion of the input data stream. In some cases, the history can be stored in a fixed sized, sliding window type history store, from which the oldest data exits as new data from the input data stream is added. Accordingly, with these prior LZ encoders an input data stream can be encoded with respect to preceding data in that same input data stream. LZ encoders can achieve compression of the input data stream because the match codes can be much smaller than the substrings that they represent.

An entropy encoder can be used to encode repeated patterns in LZ encoded stream with a minimum number of bits to achieve entropy closest to a theoretical limit of Shannon entropy. Huffman Coding encoding can be used for lossless compression schemes and may have computational advantages over other schemes such as Arithmetic Coding. Zstandard (zstd or ZSTD) (e.g., Internet Engineering Task Force (IETF) RFC 8478 "Zstandard Compression and the application/zstd Media Type" (October 2018)) can use a form of entropy encoding called Finite State Entropy (FSE) and can be much faster than normal Arithmetic Coding yet achieve a measure of entropy very close to Shannon entropy and can achieve a better compression ratio than that of Huffman Coding. The encoding stage for Zstandard can encode input data based on a Normalized Probability (NP) of a given input symbol.

A compression engine can capture and analyze heuristics during hash and search stages to select a lossless encoding algorithm. Heuristics can include one or more of: search string match length ("Len"), search distance offset from the search string match to a prior instance of the string ("Dis"), and a literal length distance between two pattern matches, expressed in length of the literals, from an end of a first pattern to start of a second pattern, where the second pattern is the same or different than the first pattern ("Lit Len"), as well as input stream size and input stream type. Lossless encoding schemes can include encoding schemes such as the LZ family including, but not limited to, LZ77, LZ4, LZS, Zstandard, DEFLATE, Huffman coding, and Snappy standards and derivatives. For example, LZ77 streams are described in Ziv et al., "A Universal Algorithm for Sequential Data Compression," IEEE Transactions on Information Theory (May 1977).

An LZ77 based compression algorithm (e.g., zlib, zstd) achieves lossless compression by replacing repeated occurrences of data in an input stream with references to a single copy of that data existing earlier in the uncompressed stream. Different LZ77 compression algorithms support different values for the maximum backward reference, referred to here as Window Size or History Buffer Size. LZ77 compression algorithms include DEFLATE (e.g., maximum window size of 32 KB), LZ4 (e.g., maximum window size of 64 KB), and ZSTD. ZSTD supports different Window Sizes and can increase the Window Size to 128 KB to provide significant incremental compression benefits at different compression levels. At higher compression levels, larger Window Sizes and search depths (e.g., maximum number of searches for a byte position) are used to achieve higher compression ratios.

Some solutions support a Maximum Window Size of 64 KB and a Maximum Search Depth of 16 searches for a byte position. In order to achieve a high throughput, 8 copies of the 64 KB History Buffer can be instantiated and the design can be scaled to support a Window Size of 256 KB. In addition, the Hash Table can be scaled to support a Maximum Search Depth of 64 (to achieve benefits of a larger Window Size). The History Buffer (HB) memory can be increased from 512 KB (8*64 KB) to 2 MB (8*256 KB). However, this solution can result in a significant silicon die area increase for the compression device, including memory used to store data.

Some solutions increase the Maximum Search Depth but not the Maximum Window Size. Instead of increasing the HB memory to 2 MB (8*256 KB) to support a window size of 256 KB, the HB memory (e.g., 8*64 KB=512 KB) can be repurposed to function as two copies of a 256 KB buffer in a high-ratio mode. History Buffer Addresses (HBAs) can be scattered across the different HB instances and it is possible that all HBAs (e.g., 64 HBAs) target the same physical HB instance, such as within the same 64 KB window. A growth in silicon area in each Search Engine can result to support up to 64 HBAs per byte position. In some cases, Search Engine utilization can be lower as the work may not be distributed evenly across the different HB instances. For example, where 64 HBAs target the same HB instance, the Search Engine associated with that HB instance may overloaded while the other Search Engines may be idle.

Accordingly, supporting multiple compression algorithms while achieving silicon die area constraints and power consumption targets can be a challenge. Various embodiments provide a compression engine that can support multiple lossless algorithms (e.g., at least zstd, zlib) with different window sizes and different search depths while maintaining silicon die area and achieving power usage constraints. Various embodiments can reuse search engines and reconfigure memory to store matches found (e.g., scoreboard queue entries and one or more copies of a history buffer addresses) to support different compression schemes with different search depths.

Some embodiments provide a compression engine to support compression algorithms that use a smaller block size (e.g., zlib) for a higher compression throughput (e.g., speed of encoding) and can also support compression algorithms that use a larger block size (e.g., zstd) for a higher compression ratio (e.g., smaller sized encoded data). Some embodiments use a higher search depth for a larger block size in order to find a more distant backward reference to increase compression matches and thereby can consume more memory during compression. Various embodiments adapt history buffer size based on algorithm type or expected variable data stream size. A history buffer size can be related to incoming packet rate and packet length.

Various embodiments provide a compression circuitry that supports use of different algorithms with different block sizes (e.g., zstd with block sizes up to terabytes for a maximum supported window size or DEFLATE with a maximum supported window size up to 32 KB, or other sizes). Various embodiments provide for a History Buffer operating one of various modes (e.g., at least 64 KB or 256 KB) and the History Buffer is coupled to one or more scoreboard queue entries (SBQs) working on a same byte position based on a Hash Unit (HU) input pointer spanning multiple History Buffers. Various embodiments can potentially provide a compression ratio and higher compression and decompression throughput.

Various embodiments support higher windows size used by zstd or other compression standards while not exceeding silicon die area constraints of a memory used by a compression engine. For example, for zstd, 16 SBQ entries can be used with 2 copies of approximately 256 KB HB (logical), supporting higher zstd compression levels by operating on a larger window size. For example, for DEFLATE, 64 SBQs can be used with 8 copies of 64 KB HB where 8 SBQs are mapped to single copy of the HB.

Various embodiments provide a reconfigurable LZ77 compression engine that can operate in at least two modes, namely, a high-throughput mode that supports HB sizes up to 64 KB and a high compression ratio mode that supports HB sizes up to 256 KB.

FIG. 1 depicts an example system. A compression engine can include a Hash Table 120 that stores pointers to potential matches. For each input byte, its following 2 or 3 bytes (or other number of bytes) can be hashed to generate an address for Hash Table lookup. A Hash Table entry can provide one or more history buffer addresses (HBAs) where prior input data hashed to the same value. A number of HBAs stored in a hash table entry can correspond to a maximum search depth. However, higher values for a search depth can result in a higher Hash Table area and lower throughput due to increases in the number of searches. The HBAs from Hash Table 120 can be sent to Search Units 112 where multiple Search Engines can operate in tandem to identify a best possible match for the byte position. A match result can include a length and distance pair.

Various embodiments provide a reconfigurable Hash Table 120 (e.g., table that stores pointers to potential matches in an input data string) that can support at least two modes of operation (e.g., high throughput mode or high compression ratio mode). For example, in a high throughput mode, Hash Table 120 can maintain approximately 16 k hash table entries (buckets) of up to 16 prior History Buffer addresses (HBAs) for each byte position. In some examples, Hash Table 120 can be physically organized as 32 banks of 512 buckets with 16 prior History Buffer Addresses (HBAs) per bucket. However, depending on the mode of operation, the logical configuration of Hash Table 120 can change. For example, in a high compression ratio mode, Hash Table 120 can maintain approximately 4 k buckets of 64 HBAs for each byte position of an input data stream. In the high compression ratio mode, resource re-utilization can be enabled by implementing a quasi-search depth 64 mode whereby the maximum number of pointers within a 64 KB region in a 256 KB window can be limited to 16. However, depending on the mode of operation, the logical configuration of Hash Table 120 can change.

Although reference is made to lossless compression, techniques described herein can be used for lossy compression schemes that use approximations and data discarding to represent content such as, but not limited to, video compression, image compression, or audio compression. Examples of lossy compression schemes include at least transform coding, wavelet compression, JPEG, MPEG variants, H.264/Advanced Video Coding (AVC), H.265/High Efficiency Video Coding (HEVC), VC-1, Advanced Audio Coding (AAC), or MP3.

Input data 102 can be written into Look-Aside-Queue (LAQ) 104. Input data 102 can be uncompressed data of raw data code or a "literal" that designates the character as plain text or clear text. Input data 102 can be segmented at a character level or byte level. A byte can be a character for ASCII scheme. Other schemes can be used to represent characters such as UTF-8, where a character can span more than 1 byte.

In some examples, three pointers can be associated with Look-Aside-Queue 104, namely, a tail pointer, a head pointer, and a current pointer. The received uncompressed data 102 is inserted at the tail of LAQ 104. The tail pointer stores the location (entry) in LAQ 104 in which data can be inserted in LAQ 104. The head pointer identifies the entries in the LAQ 104 that store data that has been compressed using an encoder and can be flushed from LAQ 104. After data from LAQ 104 has gone through encoding, the data at the head pointer is flushed into HB 106 at the HB write pointer. The number of bytes flushed to HB 106 can vary depending on implementation and compression standard. The current pointer can refer to the position at which the Hash Units 108 obtain their next input data, and normally advances by the number of HUs 108 (e.g., 8 bytes). A HU can be assigned a current stream position.

In some examples, hash units (HU) 108 can perform hash operations on 3 to 4 byte groups of input data from LAQ 104 to determine History Buffer Addresses (HBAs) of potential prior data positions where a match could be found. For example, compression scheme LZ4 can use a 4-byte hash function, whereas compression scheme DEFLATE can use a 3-byte hash function. Sizes other than 3 to 4 bytes can be used such as 1 byte, 2 bytes, 5 bytes, and so forth. In an example where HU 108 can perform hash and lookup operations on 8 groups of bytes in parallel (e.g., groups with bytes 0-2, 1-3, 2-4, 3-5, 4-6, 5-7, 6-8, and 7-9 represented as groups 0 to 7 respectively), HU 108 can read groups 0-7 from LAQ 104 starting at the LAQ current position. For a 3-byte hash as an example, if the bytes in LAQ 104 are "ABCDEFGHIJKLMN", then 8 hash functions are performed on the 3 bytes: "ABC", "BCD", "CDE", "DEF", "EFG", "FGH", GHI, and "HIJ". HU 108 may hash groups 0-7 and can search the hash results against hashes stored in hash table 120. A hash function is applied to produce a 12-bit hash table index, for example.

Hash Unit 108 can compare the current stream position (LQA) against the retirement pointer when updating its corresponding SBQ entry or entries. A retirement pointer can indicate a position of the input data that has not been encoded into an LZ77 stream (or other stream) and is next in line to be encoded. The retirement pointer can be updated during the encoding stage based on characters provided for inclusion in the LZ77 stream. The retirement pointer can indicate a position of the input data that has not been encoded into an LZ77 stream (or other stream) and is next in line to be encoded. If the retirement pointer is greater than the current stream position (LQA), Hash Unit 108 can set the Squash Bit (SQH) when updating its corresponding SBQ entry or entries.

Hash table (HT) 120 can store HBAs and HBAs can be looked-up based on hash values/index values. In some embodiments, there are 32 banks of HT memory in order to reduce the average number of bank conflicts from the 8 Hash Units 108 read requests to the HT. A bank can provide up to 16 HBAs to the HU 108 requesting the bank. In some embodiments, 16 parallel Hash Tables (HTs) 120 are provided, allowing storing and retrieving up to 16 HBAs with a single hash table index. Retrieving up to 16 HBAs can allow for up to 16 search operations for a given byte position. The hash index can provide a read address (e.g., bank number plus location within the bank) to retrieve the HBAs. HT 120 can provide corresponding HBAs (e.g., up to 16) for a hash index. If there is no entry for a hash index in HT 120, HT 120 can provide no HBA or an indication of an invalid entry. An HBA can represent a prior stream position that is a potential match with a current group position. In some examples, HU 108 can write a group position (e.g., 0-7) for the first 8 bytes of input data and corresponding hash index into an entry in HT 120. For subsequent input bytes, the group position could increase. A hash index can be the location (address) in the HT that can be read, written-to, or overwritten.

HU 108 may output to SBQ 110 identified history addresses (HBAs) and a valid indication (e.g., present in the HT 120 and in range of the History Buffer window). HU 108 can provide to SBQ 110 portions of an input data 102 and HBAs. Agent 111 can monitor SBQ 110 and in response to valid HBAs being available, agent 111 can trigger one or more search units (SUs) 112 to perform a search for a prior portion of input data 102. SUs 112 can provide to SBQ 110 search results including (Length of Match, Offset in History). SUs 112 can attempt to find data string(s) from LAQ 104 or HB 106 using the HBA to find a match for an input data string. SUs 112 can retrieve from SBQ 110 one or more of (entry number, Stream ADDR (e.g., stream position LQA), history address (HBA)). Middle bits of the HBA can be used to convert an HBA to a position or memory location in LAQ 104 or HB 106. SU 112 can compare data from LAQ 104 or HB 106 provided based on the HBA with characters of a group position for which HU 108 identified a potential match. In some examples, SU 112 can process chunks of 16 bytes or other sizes. In some cases, the history data has not yet been flushed to HB 106 where the HBA is close to the group position. SUs 112 can obtain history data from the LAQ 104 instead of HB 106 for HBAs that are close to the group position.

If a match is found, SU 112 may supply the Dis and Len that is found corresponding with its stream (group) position. A match selector 113 can choose a result from multiple SUs 112 with a longest character match (Len) and if Len of several search results are the same, a result with the smallest offset (Dis) is selected. Match selector 113 may provide the Len and Dis to SBQ 110 for the character string associated with the selected Len and Dis and a character string (e.g., token) is available for encoding a corresponding current group position. If no match is found between any characters of the group position that caused the HU 108 to provide the HBA and the segment retrieved from LAQ 104 or HB 106 using the HBA, a literal can be made available for encoding a corresponding current group position. For example, for a hash involving bytes 0-2, a result will be placed in entry 0.

In some embodiments, when SUs 112 are finished searching a group of one or more character strings, a SWEEP_ME signal is triggered. SWEEP_ME state can trigger deallocation to remove one or more entries from scoreboard queue 110 and copy input strings associated with deallocated entries from LAQ 104 to history buffer 106.

History buffer (HB) 106 can be used to store clear text data or plain text data ("history data") that has been processed by an encoder. The clear text data stored in the history buffer 106 can be referred to as a "dictionary." The dictionary can be created on the fly during compression and re-created on the fly during decompression. History buffer 106 can act as a sliding window/circular queue. When HB 106 is full, the oldest data at the head of the history buffer 106 can be overwritten by data read from LAQ 104 that has been processed by an encoder. A size of HB 106 can vary depending on a compression standard used (e.g., DEFLATE, LZ4, LZ77) and number of accessible parallel copies. For example, HB 106 can be setup as 32 KB for DEFLATE compression and 64 KB for LZ4 compression.

Scoreboard Queue (SBQ) 110 can be used by HU 108, SUs 112, and Deallocation and delayed match mode (DDMM) logic 116 as an information repository. In one example, SBQ 110 can track 64 consecutive stream positions (e.g., 0 to 63, 1 to 64, 2 to 65, and so forth). A position is the starting point for attempting to search for as long a match as possible. The following table provides a generic list of elements stored in an SBQ entry for a group byte position index.

| Element | Example Description |
|---|---|
| SBS | Indicates the present SBQ state (e.g., idle state, SU state, SWP state) |
| SBQ Idle (SBI) | When set this bit indicates that the SBQ is in use. This bit is cleared after the encoding. |
| Leading LAQ Byte (LQB) | The first byte of the 3-byte or 4-byte group that was hashed. This can be the literal byte at the stream position (from the Hash Unit). |
| Leading Byte Address (LQA) | Location in LAQ for comparing against the History Buffer location(s). This can be the stream address or group position (from the Hash Unit). |
| History Buffer Address [0:15] | In some examples, up to 16 History Buffer Address (HBA) are read from the HT 120 by HU 108. These HBAs are used for search operations in the LAQ 104 or HB 106. |
| Match Length[n]/Match Offset Array[n] | List of search results from SUs. DDMM logic 116 can use these values to encode the input stream. |
| Search Match Offset (SMO) | Variable Dis from search units. |
| Search Match Length (SML) | Variable Len is Search Match Length (from SUs). |
| Squash bit (SQH) | DDMM logic 116 can set this bit to indicate that the leading LAQ byte has already been used by a previous match. |

According to some embodiments, Deallocation and Delay Match Mode (DDMM) 116 receives match results for consecutive input stream positions and can decide which tokens (e.g., character or byte sequence) are chosen for inclusion in an LZ compression stream encoding. DDMM 116 can delay the selection of token matches from multiple search results such that after a match of length N has been found, the DDMM 116 searches for a longer match starting at the next input position. For example, DDMM 116 can compare an identified token of a first stream position with tokens for the next two consecutive stream positions, and if either position has a longer match, the identified token for the first stream position is converted into a literal. DDMM 116 can hold a match result of a token for a position to make a delayed match decision based on literals or token(s) for next consecutive or later stream positions.

For example, from SBQ 110, available literal or token representations of three consecutive entries can be examined to determine whether to provide any token in the consecutive entries to an LZ77 stream or to use the literal instead. In other embodiments, more or fewer than three consecutive entries can be examined. For example, when consecutive entries 0-2 have search results indicating a literal and zero or more tokens, and entry 0 represents a portion of an input stream that is received earlier in time than that of entry 1, and entry 1 represents a portion of an input stream that is received earlier in time than that of entry 2. In a case where entry 0 is a literal, the literal for entry 0 can be encoded in an LZ77 stream. However, if entry 0 is represented by a token that is longer than a token for entry 1 and a length of a token for entry 2 is not two or more characters longer than a length of a token for entry 0, then the token for entry 0 is provided for inclusion in the LZ77 stream. If entry 0 is represented by a token that is longer than a token for entry 1 and entry 2 is a literal, then the token for entry 0 is provided for inclusion in the LZ77 stream. If entry 0 is represented by a token, entry 1 is a literal, and entry 2 is a literal, then the token for entry 0 is provided for inclusion in the LZ77 stream.

In some embodiments, if entry 0 is represented by a token, entry 1 is represented by a token, and if the token for entry 1 is longer than the token for entry 0, then the entry 0 is reverted to its literal and provided for inclusion in the LZ77 stream but the token for entry 1 is held for a delayed match decision against literal(s) or zero or more token(s) in later stream positions. The token for entry 1 can be held for examination of entries 1, 2, and 3 or entry 1 and other entries.

In some embodiments, if entry 0 and entry 1 are represented by tokens, but the token for entry 1 is not longer than the token for entry 0, and the entry 2 is represented by a token that is at least two characters longer than the token representing entry 0, then the tokens for entry 0 and entry 1 are rejected and literals corresponding to entry 0 and entry 1 are provided for inclusion in the LZ77 stream. In other examples, instead of at least two characters difference between a token for entry 2 and a token for entry 0, other numbers can be used such as 1, 3, 4 and so forth. The token for entry 2 can be held for examination of entries 2, 3, and 4 or entry 2 and other entries.

DDMM 116 can maintain a retirement pointer that identifies a next stream position that has not been included in the LZ77 stream (or other type of stream, e.g., LZ78) for the input data stream. The retirement pointer can be updated to refer to the next position in an input stream that has not been selected for inclusion in the LZ77 stream. After DDMM 116 selects a token or literal for an input stream position, the retirement pointer can be updated to point to a literal after the token or literal that has been selected for inclusion in the LZ77 stream. The retirement pointer can be sent to SBQ 110 to squash SBQ entries that are less than the current retirement pointer because those results will not be used.

DDMM 116 can squash (suppress) incoming stream positions that are less than the current retirement pointer from inclusion into the LZ77 stream. In cases where the current position pointer (LQA) does not match the retirement pointer, a literal or token referred to by the current position pointer can be discarded and the current position pointer can be advanced.

DDMM 116 can stop one or more search units from searching for matches within an incoming uncompressed data stream. Advancing the retirement pointer frees search units to search after the committed literal or token and avoid performing operations that have been completed. SUs 112 corresponding to squashed SBQ entries can stop search for matches and powered down or allocated for searching for matches for other SBQ entries.

DDMM device 116 can use contents of the SBQ entries to generate a representation of an input data stream and the representation can be an LZ77 stream. DDMM device 116 can receive or retrieve serial, in-order, results from SBQ 110 indicating Dis, Len, and a literal (as the case may be) for a group position. For example, DDMM device 116 can receive the match results for 8 consecutive stream positions from SBQ 110 and can decide which tokens will be chosen for the LZ77 stream. DDMM 116 can generate an LZ77 stream with literals and zero or more tokens. DDMM 116 can generate a literal length (Lit Len) for an LZ77 stream, where literal length can represent a gap, expressed in length of the literals, between two pattern matches (e.g., tokens) from an end of a first pattern to start of a second pattern, where the second pattern is the same or different than the first pattern. For example, DDMM 116 can provide Output Encoding Logic (OEL) the following information directly or via Score Board Queue (SBQ).

| Field | Example description |
|---|---|
| Valid | Valid bits for 8 possible LZ77 results. |
| EOF | Indicates the last set of LZ77 output, or if none of the output is valid, that no more LZ77 output is available. |
| Length | Lengths for 8 LZ77 results. A length of 1 indicates a literal (value = LQB), otherwise a <Length, Distance> pair (token). |
| Distance | Distances for 8 LZ77 results. |
| Literal Length | A gap between pattern matches. |
| LQB | Leading bytes for the 8 LZ77 results (used for literals) |

Compression scheme selector (CSS) module 114 can use literal length (Lit Len) from DDMM 116 and Dis and Len from DDMM 116 or SBQ 110. CSS module 114 can select a compression engine to use (e.g., LZ4, DEFLATE, Zstandard (ZSTD), LZS, none, and so forth) to compress the LZ77 format stream based on a file type, file size, and heuristics of the stream of LZ77 stream. A file type can include text, image, media, although other types can be used. A file size can be a size of an uncompressed input stream in kilobytes and megabytes but other sizes can be used. For example, compression scheme selector (CSS) module 114 can perform any of one or more: (1) calculate percentage representations of Len, Dis, Lit Len; (2) calculate standard deviations of Len, Dis, and Lit Len; (3) compare those values against pre-determined criteria; and (4) determine encoding/compression scheme for Output Encoding Logic 122 to use to encode/compress an LZ77 stream based at least on the criteria. Criteria for selecting an encoding scheme can be set by cloud/communications service provider or generated by artificial intelligence (AI). The compressed stream can be output for transmission to a device or stored for later access to reduce memory or storage use.

In various examples, the encoder system can be incorporated into a system on chip (SoC) with one or more of a CPU, GPU, memory device, storage device, an accelerator, a cryptographic accelerator device, network interface, infrastructure processing unit (IPU), data processing unit (DPU), smartNIC, or fabric interface. In various examples, the encoder system can be coupled using a device interface (e.g., Peripheral Component Interconnect Express (PCIe), Compute Express Link (CXL), or others) with one or more of a CPU, GPU, memory device, storage device, an accelerator, a cryptographic accelerator device, network interface, infrastructure processing unit (IPU), data processing unit (DPU), smartNIC, or fabric interface. See, for example, PCI Express Base Specification 1.0 (2002), as well as earlier versions, later versions, and variations thereof. See, for example, Compute Express Link Specification revision 2.0, version 0.7 (2019), as well as earlier versions, later versions, and variations thereof.

For example, a cryptographic accelerator device can include Intel® quick assist technology (QAT) or any accelerator device whereby a processor-executed application, OS, or driver can offload performance of symmetric cryptography, encryption and authentication, asymmetric encryption, digital signatures, and lossless data compression to the accelerator device. For example, the accelerator device can perform cipher operations (AES, DES, 3DES, ARC4); wireless (Kasumi, Snow, 3G); hash or authentication operations (SHA-1, MD5, SHA-2 [SHA-224, SHA-256, SHA-384, SHA-512]); authentication (HMAC, AES-XCBC, AES-CCM); or random number generation. The accelerator device can perform public key functions such as: Rivest-Shamir-Adleman (RSA) cryptographic operations; Diffie-Hellman operation; digital signature standard operation; key derivation operation; or elliptic curve cryptography (e.g., Elliptic Curve Digital Signature Algorithm (ECDSA) and Elliptic-curve Diffie-Hellman (ECDH)) random number generation and price number testing.

An IPU or DPU can include a network interface with one or more programmable or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices.

A serverless application or function (e.g., Function as a Service (FaaS)) can use available compression resources as well as computing resources at a data center, edge computing device, or fog network device or in disaggregated computing and memory resources. For example, for a serverless application, a cloud service provider dynamically manages allocation and provisioning of servers and a serverless application runs in stateless compute containers that are event-triggered and may last for one invocation. A serverless application can be event-driven, cloud-based application where application development relies on a combination of third-party services, client-side logic and cloud-hosted remote procedure calls. Serverless application can be pay-per-use computing or bare-code where users are charged based on time and computing resources (e.g., CPU, networking, or memory) allocated to run serverless application without associated fees for idle time of computing resources. In some examples, a serverless application or function can be performed by a network infrastructure device (e.g., forwarding element, router, switch, network interface controller) or accelerator, in addition or alternative to use of a server or general purpose computing platform.

FIGS. 2-5 depict examples of various system configurations that can be implemented as separate or shared logic where a configuration can be selected based on applied mode using a configuration register sets programmed by an application using a command bundle.

Figure 2:
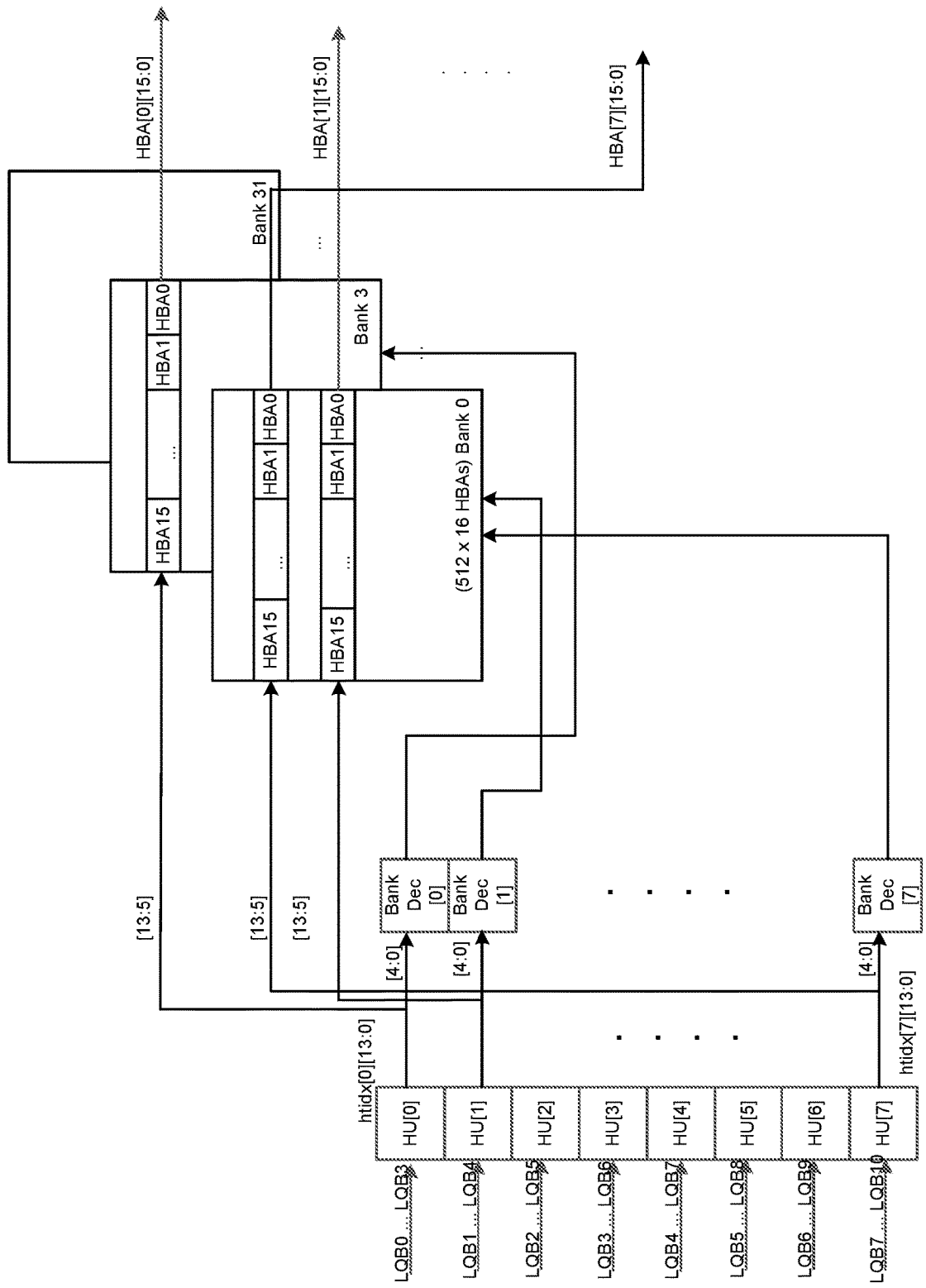
FIG. 2 depicts a configuration of a system.

FIG. 2 depicts an example of a 64 KB HB Hash Table configuration with a search depth of 16. In the 64 KB HB Hash Table mode, a Hash Table can be logically organized as approximately 16 k buckets with 16 HBAs in each bucket. For example, a bucket can include HBA15 . . . HBA0. In some examples, HBA15 . . . HBA0 can represent byte positions within a 64 KB HB. A bank can include one or more physical memories accessible with a read/write address and a read/write command. A bank can be read-from and written-to in one clock cycle from different address locations. In some examples, a bank is associated with 512 rows of 16 HBAs with no overlap of HBAs among banks. In some examples, a total number of HBAs that can be searched can be approximately 16 k.

A port can include an interface to a memory device with write address and write enable and read address and read enable. A port can allow a single read or write in clock cycle. In some examples, a single ported memory device can be used. But in other embodiments multiple ported memory devices can be used (e.g., dual ported). A single ported memory device can utilize less physical space because less control logic is used that physical space used by a multi-ported memory device. A dual port memory can be for higher performance but may consume more die space.

A bank can be populated with stream addresses (aka group positions) corresponding to the input stream data. Banks can be organized so that HBAs in a bank are not repeated in another bank. HBAs have a finite width and HBAs from higher group positions can alias to HBAs from previous lower positions, so HBAs could be repeated if the previous HBAs (which are now out of range) are not evicted (or pruned) from the HT. A memory bank can include a single port input that can emulate multi-port memory by use of a serializer to serialize received access requests (described later). From a memory area standpoint, multiple banks with a single port can provide more memory than a memory device with multiple ports for a particular silicon area footprint. Multiple banks with a single port can support parallel receipt of multiple access requests.

Based on a configuration input indicating operation in 256 KB Hash Table configuration, hash functions and bank decoders can be configured for use as described herein. Inputs LQB0 to LQB10 can represent bytes 0 to 10 of an input stream. In some examples, 8 byte positions can be hashed per clock cycle. HU0-HU7 can represent Hash Units (HUs) that perform parallel hashing of respective LQB0-3, LBQ1-3 . . . LB Q7-10. HU0-HU7 can output 8 hash index outputs (e.g., htidx). In some examples, 8 hash units (HUs) (e.g., HU[0] to HU[7]) can be used to select among 32 banks.

For a 16K entry hash table, each htidx can be 14 bits. Based on a configuration input indicating operation in 64 KB Hash Table configuration, a bank decoder (e.g., Bank Dec[0] to Bank Dec[7]) can receive bits [4:0] of htidx and constant values. Based on a configuration input indicating operation in 64 KB Hash Table configuration, bits[13:5] of htidx can be sent to banks.

A lower 5 bits of a 14 bit hash index (htidx) can be used to select a bank, while the upper 9 bits of the htidx can be used to select an entry in the bank. Bank decoders (Bank dec) [0] to [7] can determine a bank among banks 0 to 31 to select based on 5 least significant bits (LSBs) of htidx ([4:0]). In the absence of bank conflicts, the hash unit throughput can be 64 bits/cycle for 1R1 W banks (1 read 1 write) and a single port memory may serialize the reading of the banks on cycle N and writing the banks on cycle N+1, which could reduce the throughput to 32 bits/cycle. In some examples, 8 of the 32 banks of HBAs can be read in parallel and output HBA[0] to HBA[7]. HBAs can be used to determine where to search a HB to find a longest match. Search engines can access the HBAs to perform pattern matching.

Figure 3:
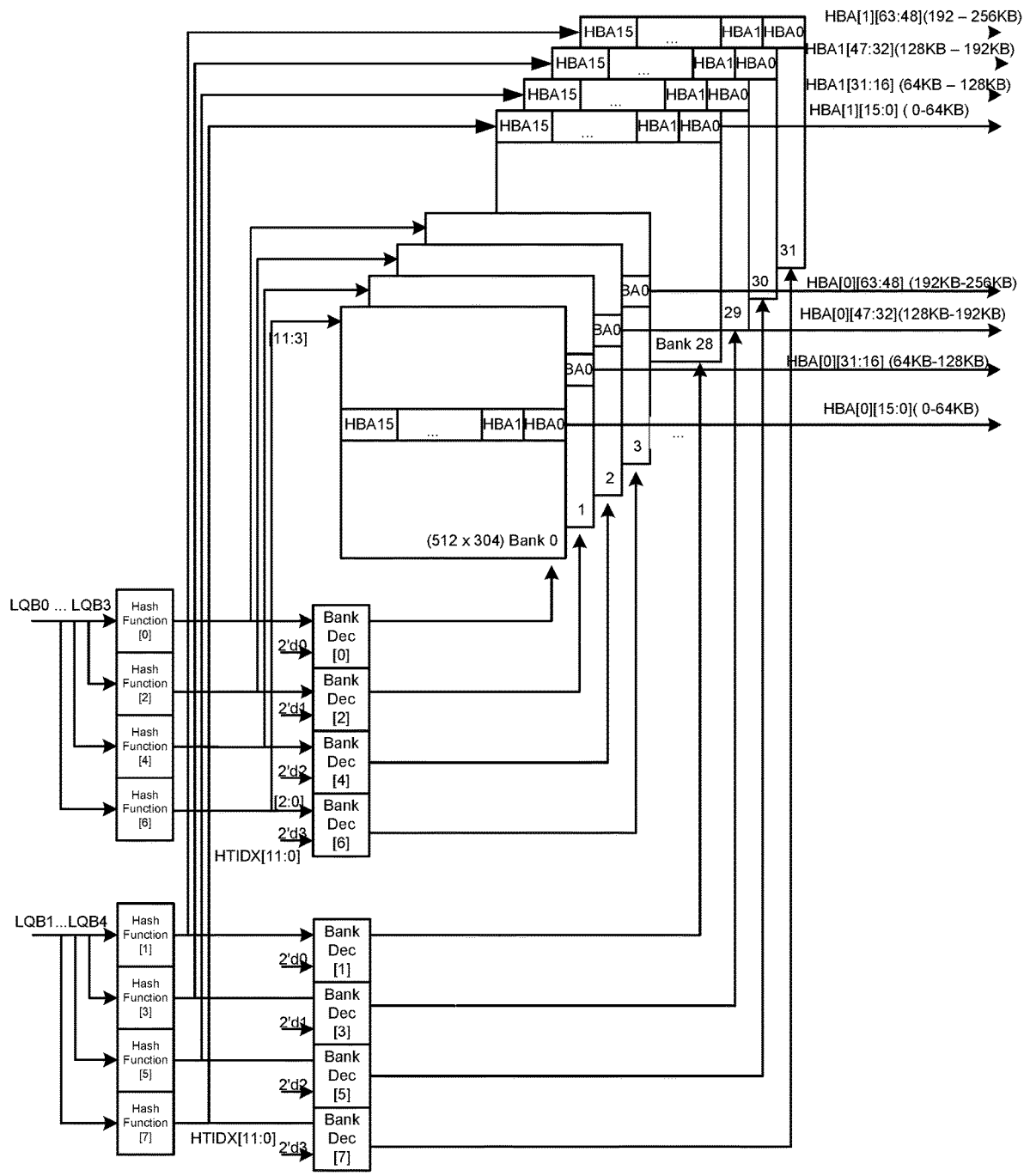
FIG. 3 depicts a configuration of a system.

FIG. 3 depicts an example of a 256 KB HB Hash Table configuration with a search depth of 64.

In some examples, 32 physical banks can be configured as 8 bank groups of 4 physical banks (e.g., banks 0-3, 4-7, 8-11 . . . 28-31). In 256 KB HB Hash Table mode, a Hash Table can be logically organized as 4K buckets with 64 HBAs in each bucket. In some examples, a bank includes unique 512 rows of 16 HBAs. A search of 4 rows of 16 HBAs from 4 banks (e.g., HBA[0] . . . HBA[63]) can occur. In this configuration, a total number of Hash Table entries can be searched can be approximately 4 k. Note that HBAs in each bank can be updated with more current HBAs by shifting out oldest HBAs (e.g., HBA15, HBA 31, HBA 47, HBA 63).

Based on a configuration input indicating operation in 256 KB Hash Table configuration, hash functions and bank decoders can be configured for use as described herein. Hash functions [0], [2], [4], and [6] can apply a same hash function and produce a same index htidx for input bytes LQB0 to LQB3. Hash functions [1], [3], [5], and [7] can apply a same hash function and produce a same index htidx for input bytes LQB1 to LQB4. In some examples, 2 byte positions can be hashed per clock cycle (e.g., LQB0 . . . LB3 and LQB1 . . . LBQ4). Bank decoders [0], [2], [4], and [6] (e.g., Bank Dec[0], [2], [4], and [6]) can receive bits [2:0] of htidx from Hash functions [0], [2], [4], and [6] and bits[11:3] of htidx from Hash functions [0], [2], [4], and [6] can be sent to banks. Bank decoders [1], [3], [5], and [7] (e.g., Bank Dec[1], [3], [5], and [7]) can receive bits [2:0] of htidx from Hash functions [1], [3], [5], and [7] and bits[11:3] of htidx from Hash functions [1], [3], [5], and [7] can be sent to banks.

In some examples, [2:0] bits of a 12 bit hash index (htidx) can be used to select a bank, while the bits [11:3] of the htidx can be used to select an entry in the bank. In some examples, as 8 physical hash units are configured as 2 groups of 4 hash units, 2 hash units can be used to select among 8 logical banks. In the absence of bank conflicts, the hash unit throughput can be 16 bits/cycle.

A bank group with banks 0-3 can receive bits[11:3] of htidx from Hash functions [0], [2], [4], and [6] and outputs from Bank Dec[0], [2], [4], and [6] and perform reads from banks 0-3 to output HBA[0] . . . HBA[63]. Similar operations can occur for bank groups with banks 4-7, 8-11 . . . 28-31. An output per bank group can be 64 HBAs. In some examples, bank decoders select 2 banks groups to 2 sets of 64 HBAs. Search engines can access the HBAs to perform pattern matching. HBAs[15] . . . [0] can represent byte positions within bytes 0-64 KB of a 256 KB HB, HBAs[31] . . . [16] can represent byte positions within bytes 64-128 KB of a 256 KB HB, HBAs[47] . . . [31] can represent byte positions within bytes 128-192 KB of a 256 KB HB, and HBAs[63] . . . [48] can represent byte positions within bytes 192-256 KB of a 256 KB HB. Note that byte positions (e.g., group positions) of 256K-320K can update the banks containing HBAs[15] . . . [0] which also stores the group positions at 0-64K. An extra bit in the HBA can indicate whether the HBAs corresponds to 0-64K or 256K-320K and the former may fall out of range of the Window Size.

Figure 4:
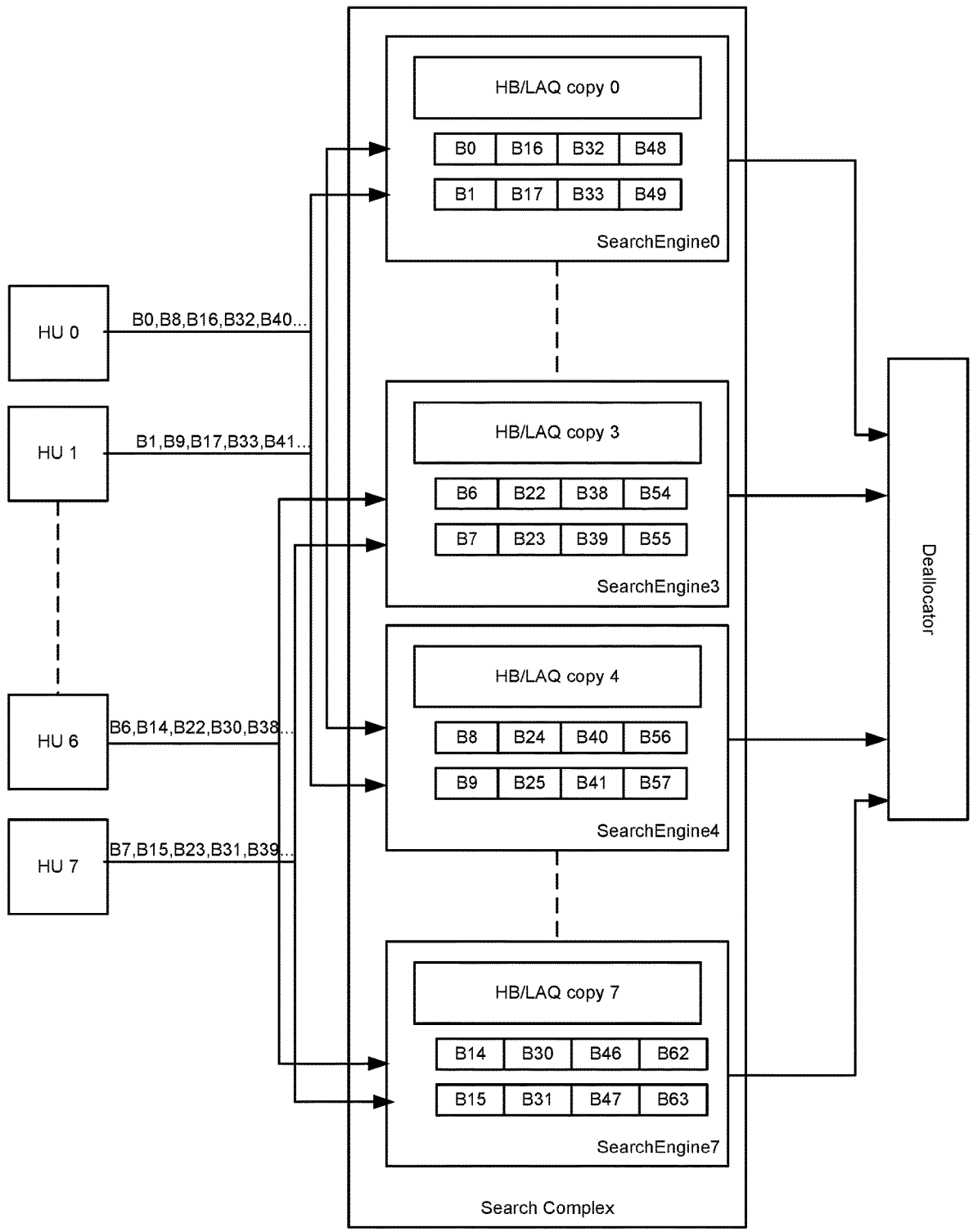
FIG. 4 depicts a configuration of a system.

FIG. 4 depicts an example of a Hash Search Complex Byte position mapping in a first mode. In this first mode, searches are applied for 64 KB HB regions and 8 copies of an HB are available for searching. HBAs from a Hash Unit can be sent to a Search Complex to find matches between byte strings in an input stream and previously received bytes of the input stream. A Stream Buffer (e.g., Input Queue 104) can include a copy of the most recent input data. In some examples, History Buffer can provide a sliding window of the input data that was already attempted to be compressed. In some examples, the History Buffer can include 64 KB of input data. Scoreboard queue 110 can store the "best" match results for N byte positions. In some examples, N=8. In some examples, B0 to B63 can represent a different group of 64 bytes of input data on which a search is performed. A search engine can update a scoreboard entry with an indication of a match or not.

In some examples, for this first mode, properties and operations of a Search Engine can be as follows. For example, a Search Engine can utilize 32 search units (SUs). A SU can receive a stream address and a history address and compare the current stream data in a Stream Buffer (e.g., Input Queue 104) with prior stream data in the History Buffer. A search result can include of a length and distance (e.g., current stream position minus a history buffer address). For the first mode where searches are applied for 64 KB HB regions, up to 16 searches may be launched in parallel per byte position and each Search Engine can access a copy of a 64 KB HB.

In the 64 KB mode, the deallocator can receive up to 1 result for each byte position and pick the best result across the 4 results. Deallocator can deallocate a maximum of eight stream positions every clock cycle. The best result can be the longest match, or if there is no longest match, the best result can be the closest match. Alternatively, the best match result can be the one with the best score of a function of length and distance.

Figure 5:
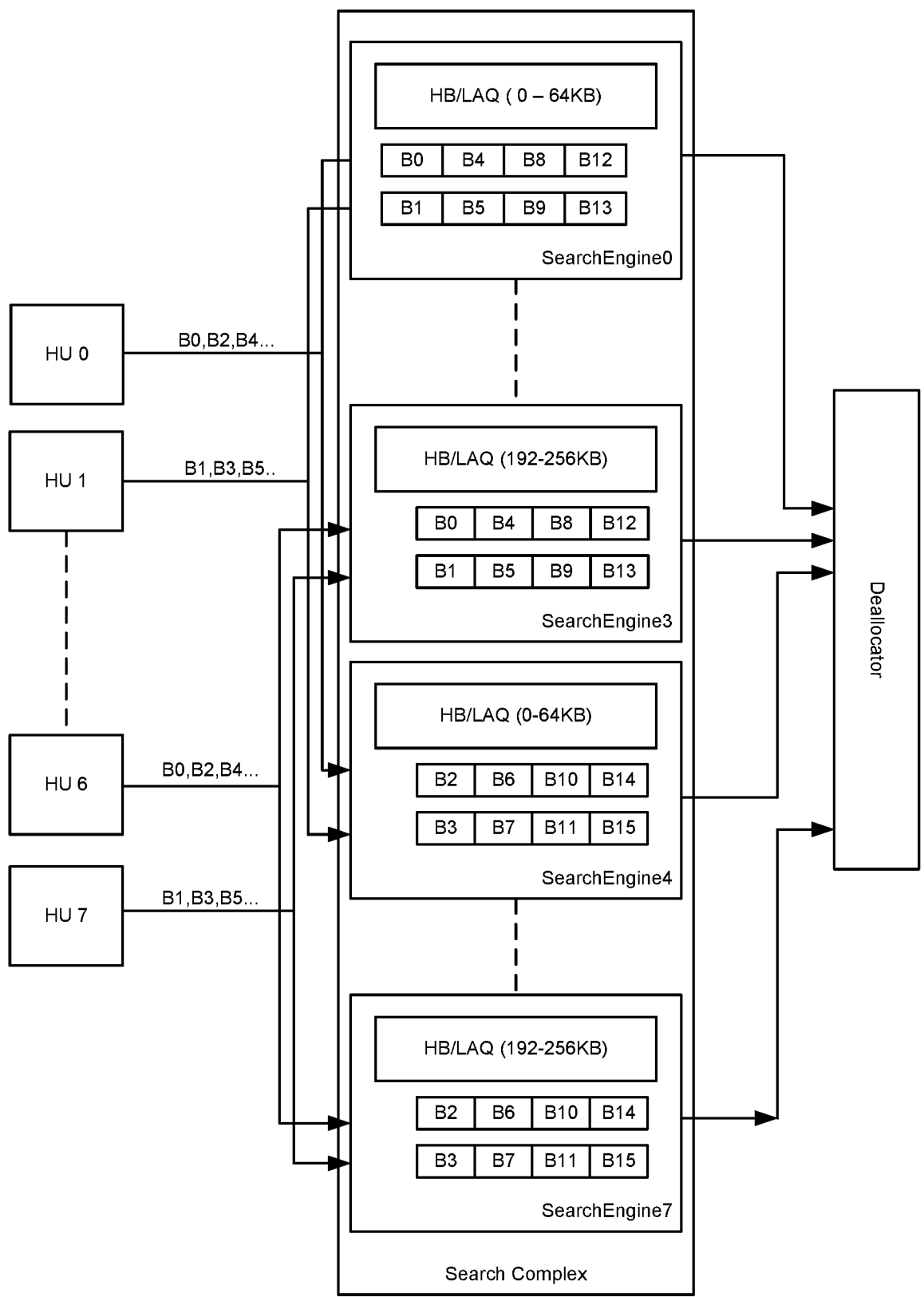
FIG. 5 depicts a configuration of a system.

FIG. 5 depicts an example of a Hash-Search Complex Byte position mapping in a second mode. In this second mode, searches are applied for 256 KB HB regions. In 256 KB search mode, 8 copies of a 64 KB HB (FIG. 4) are replaced with 2 copies of ranges of a 256 KB HB. For example, 2 copies of 0-64 KB of an HB can be stored and searched by two search engines, 2 copies of range 64 KB to 128 KB can be stored and searched by two search engines, 2 copies of range 128 KB to 192 KB can be stored and searched by two search engines, and 2 copies of range 128 KB to 256 KB can be stored and searched by two search engines. The number of bytes in flight can reduce from 64 to 16 to support 64 searches per byte position. An HB can span multiple Search Engines. For example, SearchEngine0 and SearchEngine4 can maintain the first 64 KB of the HB, SearchEngine1 and SearchEngine5 can search the second 64 KB of the HB, SearchEngine2 and SearchEngine6 can maintain the third 64 KB of the HB and SearchEngine3 and SearchEngine7 maintain the fourth 64 KB of the HB. Other configurations of search mode and number of parallel searches can be utilized.

In some examples, there is no change to the physical connections for the HBAs from Hash Units to Search Units when a mode is changed. For example, for both 64 KB and 256 KB modes (or others), HBAs from HU 0 are sent to SearchEngine0 and SearchEngine4. HBAs from the Hash Unit for a particular byte position can fan out for use by multiple Search Engines. Also, if the number of HBAs within a 64 KB window is limited to 16, the Search Complex may remain unchanged and can be used for both 64 KB and 256 KB HB modes. In some examples, if a search crosses a 64 KB HB window, the search can be terminated.

In some examples, B0 . . . B15 represent scoreboard entries corresponding to byte position in an input stream. A search engine can update a scoreboard entry with an indication of a match or not. As multiple matches are attempted, a best match can be found among multiple searches for a best match for a byte position. In the 256 KB mode, the deallocator can receive up to 4 results for each byte position and pick the best result across the 4 results. Deallocator can deallocate a maximum of two stream positions every clock cycle. The best result can be the longest match, or if there is no longest match, the best result can be the closest match. Alternatively, the best match result can be the one with the best score of a function of length and distance.

Various embodiments can use a single configuration bit to indicate operation in 64 KB or 256 KB HB Hash Table configuration. Various embodiments can include operation in sizes other than 64 KB or 256 KB HB Hash Table, such as 128 KB. For more than two HB Hash Table configurations, 2 configuration bits can be used to indicate the use of 3 HB Hash Table configurations.

Figure 6:
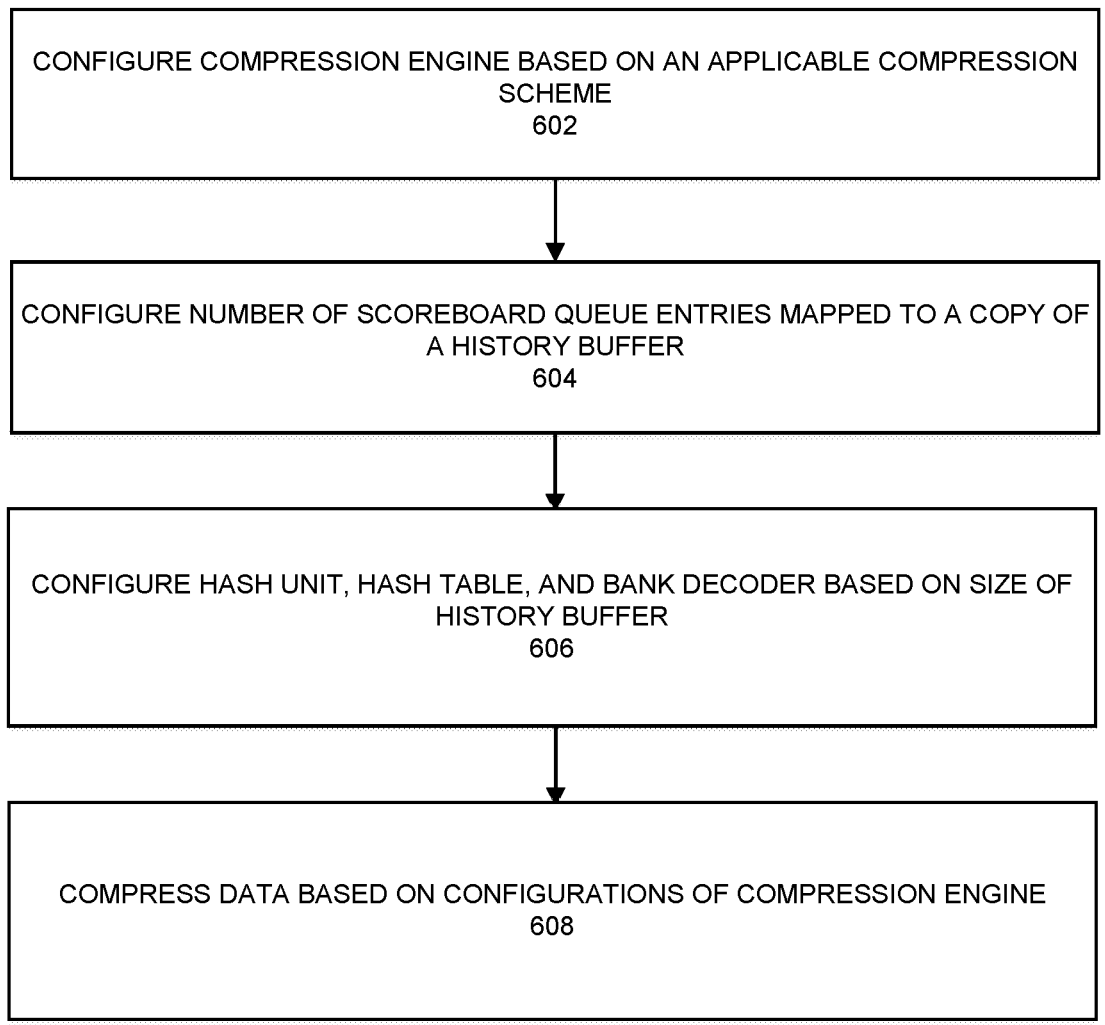
FIG. 6 depicts a process.

FIG. 6 depicts an example process. At 602, a compression engine can be configured, based on an applicable compression scheme, to operate in one of multiple history buffer size modes. The compression engine can perform one of multiple compression schemes including an LZ77 based compression algorithm. For example, the compression engine can perform compression consistent with zlib, zstd or DEFLATE. A history buffer can include clear text data or plain text data that was received in an input data stream. For example, a history buffer size can be an amount of searchable previously received characters. For example, for DEFLATE or higher throughput zstd, 8 copies of 64 KB HB can be used. For example, for zstd, 2 copies of 256K HB (logical), supporting higher zstd compression levels by operating on a larger window size. For zstd, a user can configure an HB size to be larger or smaller.

At 604, a number of scoreboard queue entries mapped to a copy of a history buffer for the compression engine can be configured. A scoreboard queue entry (SBQ) can record a match for a particular byte position in an input data stream. An SBQ can refer to a logical combination of all entries that are allocated to the same stream position such as a B0 entry in each of four Search Engines 0 to 3 (FIG. 5). For example, for DEFLATE, 64 SBQs can be used with 8 copies of a 64 KB sized HB where 8 SBQs are mapped to single copy of the HB. For example, for zstd, there can be 8 SBQs mapped to two copies of an 256 KB HB so that 4 logical SBQs are mapped to a 256 KB copy. For example, for 64 KB zstd, there can be 8 SBQs per HB copy.

At 606, a hash unit, hash table, and bank decoder of the compression engine can be configured based on a size of a history buffer. Hash units can be configured to generate hash values associated with distinct 64K HB groups or generate hash values associated with a 256K HB group. In the 64 KB sized HB mode, the Hash Table can be organized as 16K buckets with 16 History Buffer Addresses (HBAs) in each bucket. In the 256 KB sized HB mode, a Hash Table can be logically organized as 4K buckets with 64 HBAs in each bucket. A bank decoder engine can be configured based on an HB group size to select a bank for an index.

At 608, the compression engine can operate to compress input data based on its search configurations. The selected history buffer configuration and hash table configuration can be utilized for the selected compression mode. Note that in 64 KB mode, best-of-4 selection from the Search Units may not be used whereas in 256 KB mode, best-of-4 results for a byte position from the Search Units is selected.

Figure 7:
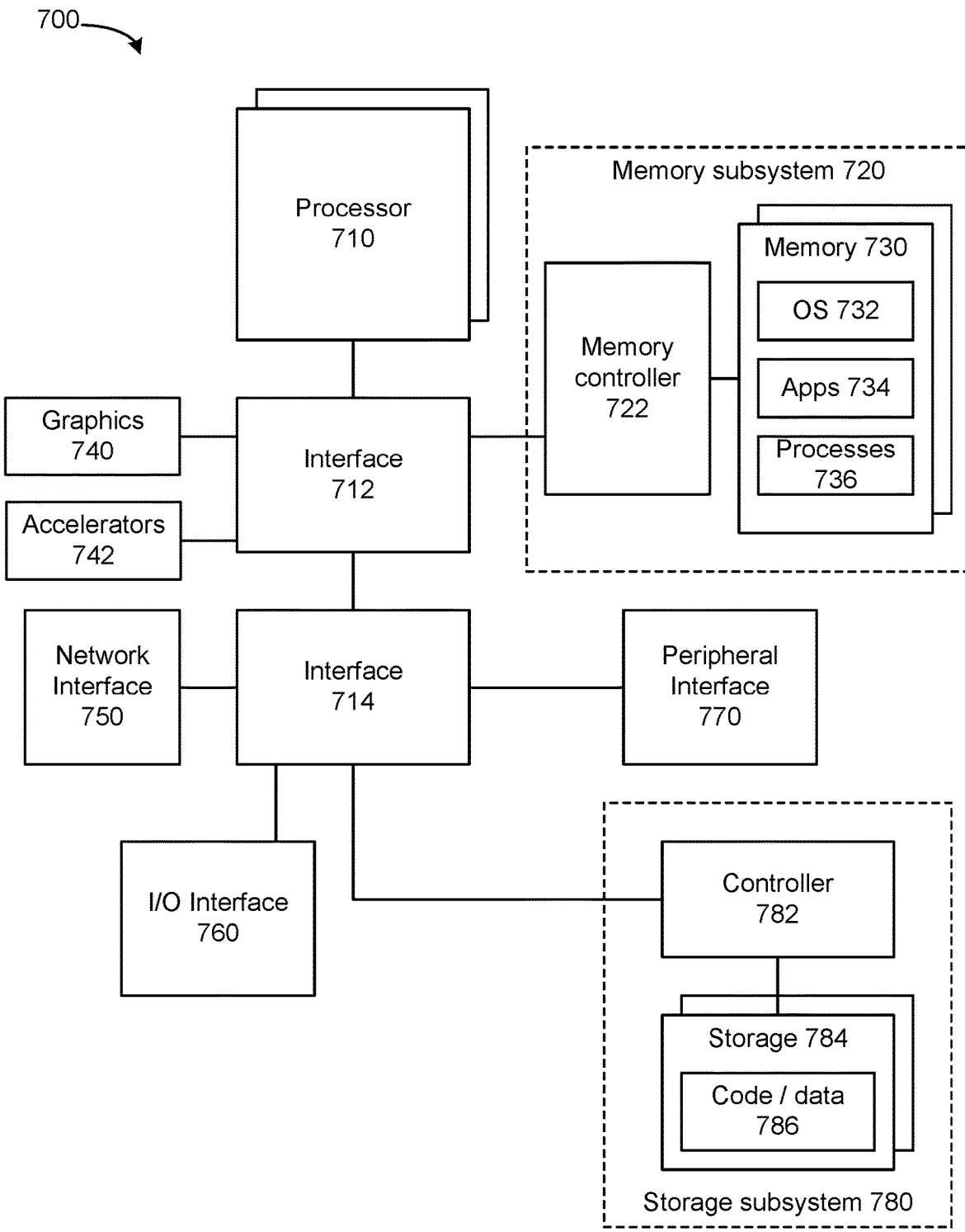
FIG. 7 depicts a system.

FIG. 7 depicts an example system. The system can use embodiments described herein to encode data using techniques described herein. For example the encoder can positioned in any portion of the system including but not limited to an accelerator, CPU, or network interface. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a programmable and/or fixed function offload engine that can be accessed or used by a processor 710 or network interface 750. For example, an accelerator can include one or more offload processors described herein. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 742 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

In some examples, OS 732 can determine a capability of a device associated with a device driver. For example, OS 732 can receive an indication of a capability of a device (e.g., NIC 750 or accelerator 742) to configure a NIC 750 or accelerator 742 to perform any of the capabilities described herein (e.g., data compression or selection of compression modes). OS 732 can request a driver to enable or disable NIC 750 or accelerator 742 to perform any of the capabilities described herein. In some examples, OS 732, itself, can enable or disable NIC 750 or accelerator 742 to perform any of the capabilities described herein. OS 732 can provide requests (e.g., from an application or VM) to NIC 750 to utilize one or more capabilities of NIC 750 or accelerator 742. For example, any application can request use or non-use of any of capabilities described herein by NIC 750 or accelerator 742.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 700 includes interface 714, which can be coupled to interface 712. In one example, interface 714 represents an interface circuit, which can include standalone components and integrated circuitry. In one example, multiple user interface components or peripheral components, or both, couple to interface 714. Network interface

750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a device that is in the same data center or rack or a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits or logic in both processor 710 and interface 714.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes a cache. A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Figure 8:
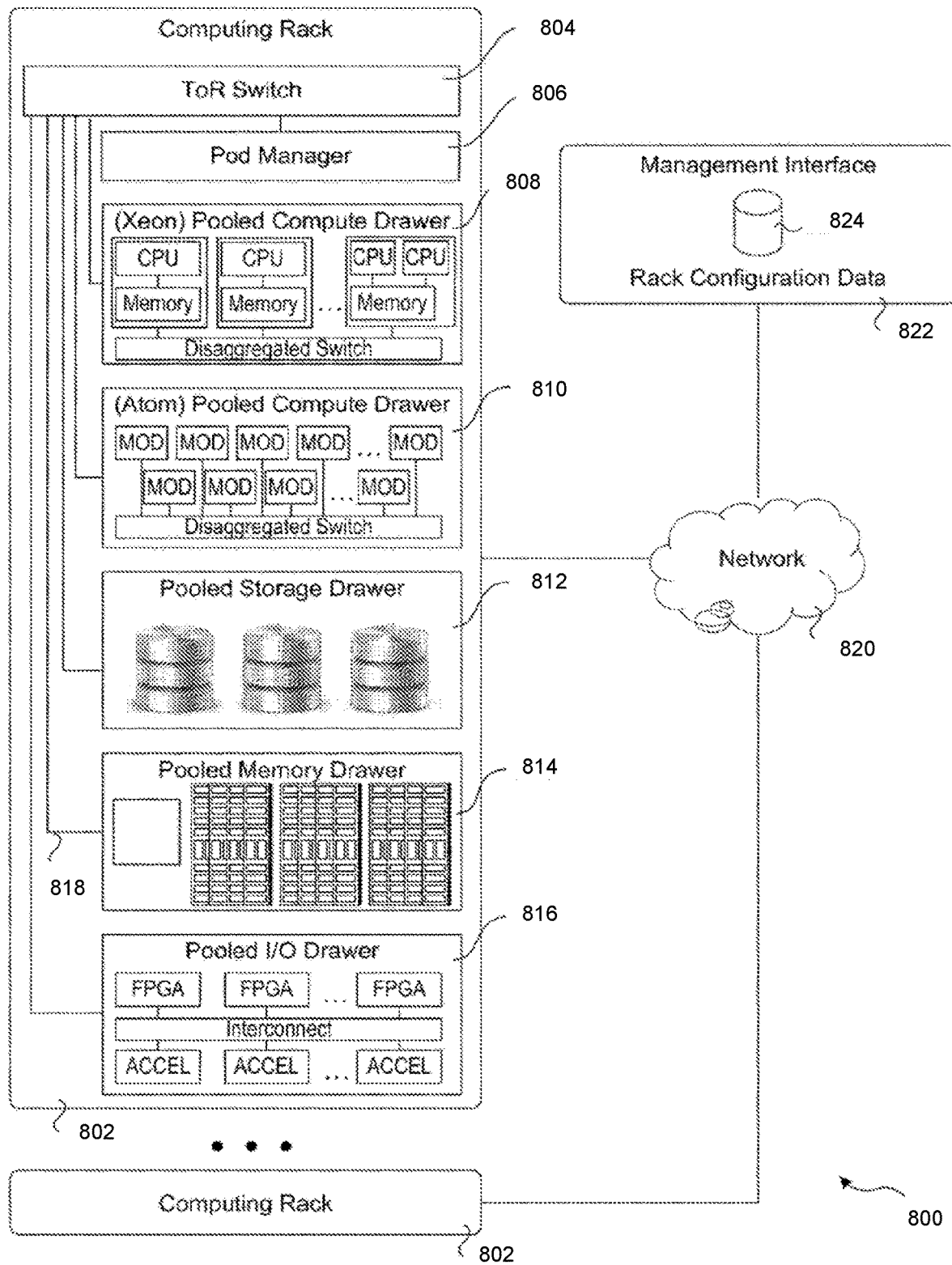
FIG. 8 depicts an example environment.

FIG. 8 depicts an environment 800 that includes multiple computing racks 802, each including a Top of Rack (ToR) switch 804, a pod manager 806, and a plurality of pooled system drawers. The environment can use embodiments described herein to encode data using techniques described herein. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 808, and Intel® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as an Ethernet link and/or a Silicon Photonics (SiPh) optical link.

Multiple of the computing racks 802 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations.

Environment 800 further includes a management interface 822 that is used to manage various aspects of the environment. This includes managing rack configuration, with corresponding parameters stored as rack configuration data 824.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes any example an apparatus comprising: an encoder circuitry to apply one of multiple lossless data compression schemes on input data, wherein to compress input data, the encoder circuitry is to utilize a search window size and number of searches based on an applied compression scheme, wherein content of a memory is reconfigured to store data corresponding to a search window size of the applied compression scheme, and wherein an applicable hash function is configured based on the applied compression scheme.

Example 2 includes any example, wherein the number of searches comprises to a number of searches for a byte position.

Example 3 includes any example, wherein the encoder circuitry comprises a hash table look-up and a bank decoder, wherein: the hash table look-up is to generate a hash index to identify an address of an entry in the search window and the bank decoder is to select a bank based on the hash index.

Example 4 includes any example, wherein the lossless compression schemes comprise Lempel Ziv-based encoding schemes based on one or more of: LZ77, LZ4, LZS, Zstandard, DEFLATE, Huffman coding, and Snappy standards.

Example 5 includes any example, wherein: when the applied lossless compression scheme is based on DEFLATE: the search window size is 64 KB and the number of searches is 16.

Example 6 includes any example, wherein: when the applied lossless compression scheme is based on Zstandard: the search window size is 256 KB and the number of searches is 64.

Example 7 includes any example, wherein the encoder circuitry is part of one or more of: a cryptographic accelerator, a central processing unit (CPU), a separate chip coupled to the CPU, a network interface, infrastructure processing unit (IPU), data processing unit (DPU), or smart-NIC.

Example 8 includes any example, and includes a network controller, wherein the network controller is to transmit the data encoded by the encoder circuitry.

Example 9 includes any example, and includes a server, rack, or datacenter coupled to the encoder circuitry, wherein the server, rack, or datacenter is to store data to be encoded by the encoder circuitry.

Example 10 includes any example, and includes a method comprising: configuring a memory to store input data corresponding to a search window size of an applied compression scheme and applying one of multiple lossless data compression schemes on the input data by utilizing a search window size and number of searches based on the applied compression scheme.

Example 11 includes any example, wherein the number of searches comprises to a number of searches for a byte position.

Example 12 includes any example, and includes configuring a hash table look-up and bank decoder based on the applied compression scheme; generating a hash index using the configured hash table look-up to identify an address of an entry in the search window; and selecting a bank associated with the search window using the configured bank decoder based on the hash index.

Example 13 includes any example, wherein the lossless compression schemes comprise Lempel Ziv-based encoding schemes including one or more of: LZ77, LZ4, LZS, Zstandard, DEFLATE, Huffman coding, and Snappy standards and derivatives.

Example 14 includes any example, wherein when the applied lossless compression scheme is DEFLATE: the search window size is 64 KB and the number of searches is 16.

Example 15 includes any example, wherein when the applied lossless compression scheme is Zstandard: the search window size is 256 KB and the number of searches is 64.

Example 16 includes any example, and includes applying one of multiple lossless data compression schemes on the input data in one or more of: a cryptographic accelerator, a central processing unit (CPU), a separate chip coupled to the CPU, or a network interface.

Example 17 includes any example, and includes a non-transitory computer-readable medium comprising instructions stored thereon, that if executed by one or more processors, cause the one or more processors to: configure a memory to store input data corresponding to a search window size of an applied compression scheme and apply one of multiple lossless data compression schemes on the input data by utilizing a search window size and number of searches based on the applied compression scheme.

Example 18 includes any example, wherein the lossless compression schemes comprise Lempel Ziv-based encoding schemes is based on one or more of: LZ77, LZ4, LZS, Zstandard, DEFLATE, Huffman coding, and Snappy standards.

Example 19 includes any example, wherein when the applied lossless compression scheme is based on DEFLATE: the search window size is 64 KB and the number of searches is 16.

Example 20 includes any example, wherein when the applied lossless compression scheme is based on Zstandard: the search window size is 256 KB and the number of searches is 64.

Example 21 includes any example, wherein the one or more processors are part of one or more of: a cryptographic accelerator, a central processing unit (CPU), a separate chip coupled to the CPU, a network interface, infrastructure processing unit (IPU), data processing unit (DPU), or smartNIC.

What is claimed is:

1. An apparatus comprising:
an encoder circuitry to apply one of multiple lossless data compression schemes on input data, wherein to compress input data, the encoder circuitry is to utilize a search window size and number of searches based on an applied compression scheme, wherein content of a memory is reconfigured to store data corresponding to a search window size of the applied compression scheme, and wherein an applicable hash function is configured based on the applied compression scheme.

2. The apparatus of claim 1, wherein the number of searches comprises to a number of searches for a byte position.

3. The apparatus of claim 1, wherein the encoder circuitry comprises a hash table look-up and a bank decoder, wherein:
the hash table look-up is to generate a hash index to identify an address of an entry in the search window and
the bank decoder is to select a bank based on the hash index.

4. The apparatus of claim 1, wherein the lossless data compression schemes comprise Lempel Ziv-based encoding schemes based on one or more of: LZ77, LZ4, LZS, Zstandard, DEFLATE, Huffman coding, and Snappy standards.

5. The apparatus of claim 1, wherein:
when the applied lossless data compression scheme is based on DEFLATE:
the search window size is 64 KB and
the number of searches is 16.

6. The apparatus of claim 1, wherein:
when the applied lossless data compression scheme is based on Zstandard:
the search window size is 256 KB and
the number of searches is 64.

7. The apparatus of claim 1, wherein the encoder circuitry is part of one or more of: a cryptographic accelerator, a central processing unit (CPU), a separate chip coupled to the CPU, a network interface, infrastructure processing unit (IPU), data processing unit (DPU), or smartNIC.

8. The apparatus of claim 1, comprising: a network controller, wherein the network controller is to transmit the data encoded by the encoder circuitry.

9. The apparatus of claim 1, comprising:
a server, rack, or datacenter coupled to the encoder circuitry, wherein the server, rack, or datacenter is to store data to be encoded by the encoder circuitry.

10. A method comprising:
configuring a memory to store input data corresponding to a search window size of an applied compression scheme and
applying one of multiple lossless data compression schemes on the input data by utilizing a search window size and number of searches based on the applied compression scheme.

11. The method of claim 10, wherein the number of searches comprises to a number of searches for a byte position.

12. The method of claim 10, comprising:
configuring a hash table look-up and bank decoder based on the applied compression scheme;
generating a hash index using the configured hash table look-up to identify an address of an entry in the search window; and
selecting a bank associated with the search window using the configured bank decoder based on the hash index.

13. The method of claim 10, wherein the lossless data compression schemes comprise Lempel Ziv-based encoding schemes including one or more of: LZ77, LZ4, LZS, Zstandard, DEFLATE, Huffman coding, and Snappy standards and derivatives.

14. The method of claim 10, wherein
when the applied lossless data compression scheme is DEFLATE:
the search window size is 64 KB and
the number of searches is 16.

15. The method of claim 10, wherein
when the applied lossless data compression scheme is Zstandard:
the search window size is 256 KB and
the number of searches is 64.

16. The method of claim 10, comprising applying one of multiple lossless data compression schemes on the input data in one or more of: a cryptographic accelerator, a central processing unit (CPU), a separate chip coupled to the CPU, or a network interface.

17. A non-transitory computer-readable medium comprising instructions stored thereon, that if executed by one or more processors, cause the one or more processors to:
configure a memory to store input data corresponding to a search window size of an applied compression scheme and
apply one of multiple lossless data compression schemes on the input data by utilizing a search window size and number of searches based on the applied compression scheme.

18. The computer-readable medium of claim 17, wherein the lossless data compression schemes comprise Lempel Ziv-based encoding schemes is based on one or more of: LZ77, LZ4, LZS, Zstandard, DEFLATE, Huffman coding, and Snappy standards.

19. The computer-readable medium of claim 17, wherein when the applied lossless data compression scheme is based on DEFLATE:
the search window size is 64 KB and
the number of searches is 16.

20. The computer-readable medium of claim 17, wherein when the applied lossless data compression scheme is based on Zstandard:
the search window size is 256 KB and
the number of searches is 64.

21. The computer-readable medium of claim 17, wherein the one or more processors are part of one or more of: a cryptographic accelerator, a central processing unit (CPU), a separate chip coupled to the CPU, a network interface, infrastructure processing unit (IPU), data processing unit (DPU), or smartNIC.

* * * * *